United States Patent
Yoshida et al.

(10) Patent No.: US 9,903,012 B2
(45) Date of Patent: Feb. 27, 2018

(54) FILM FORMATION METHOD AND FILM FORMATION APPARATUS

(71) Applicant: ULVAC, INC., Chigasaki-shi, Kanagawa (JP)

(72) Inventors: Takashi Yoshida, Tomisato (JP); Masahiro Matsumoto, Tomisato (JP); Noriaki Tani, Tomisato (JP); Susumu Ikeda, Chigasaki (JP); Masashi Kubo, Chigasaki (JP)

(73) Assignee: ULVAC, INC., Kanagawa (JP)

( * ) Notice: Subject to any disclaimer, the term of this patent is extended or adjusted under 35 U.S.C. 154(b) by 195 days.

(21) Appl. No.: 14/652,423

(22) PCT Filed: Dec. 18, 2012

(86) PCT No.: PCT/JP2012/082774
§ 371 (c)(1),
(2) Date: Jun. 15, 2015

(87) PCT Pub. No.: WO2014/097388
PCT Pub. Date: Jun. 26, 2014

(65) Prior Publication Data
US 2015/0337430 A1    Nov. 26, 2015

(51) Int. Cl.
*C23C 14/00* (2006.01)
*C23C 14/08* (2006.01)
(Continued)

(52) U.S. Cl.
CPC ...... *C23C 14/0036* (2013.01); *C23C 14/0063* (2013.01); *C23C 14/083* (2013.01); *C23C 14/10* (2013.01); *C23C 14/3464* (2013.01)

(58) Field of Classification Search
CPC .................. C23C 14/0036; C23C 14/0063
(Continued)

(56) References Cited

U.S. PATENT DOCUMENTS

| | | | |
|---|---|---|---|
| 5,314,724 A * | 5/1994 | Tsukune | H01L 21/02126 257/E21.26 |
| 2006/0065861 A1* | 3/2006 | Tazaki | G21K 4/00 250/580 |

(Continued)

FOREIGN PATENT DOCUMENTS

| | | | |
|---|---|---|---|
| JP | 2004-268311 A | | 9/2004 |
| JP | 2004268311 A | * | 9/2004 |

(Continued)

OTHER PUBLICATIONS

Translation to Kishimoto (JP 2004-268311) published Sep. 2004.*
(Continued)

*Primary Examiner* — John J Brayton
(74) *Attorney, Agent, or Firm* — Arent Fox LLP

(57) ABSTRACT

A film formation method is one for forming an organic layer comprising a fluorine-containing resin on an inorganic layer (3) formed on a substrate and comprising an inorganic substance. In the method, for the formation of the inorganic layer, a reactive sputtering procedure using water vapor as a reactive gas is carried out to form the inorganic layer on the substrate. Subsequently, the organic layer is formed on the inorganic layer. A film formation device enables the implementation of the film formation method.

9 Claims, 2 Drawing Sheets

(51) Int. Cl.
*C23C 14/10* (2006.01)
*C23C 14/34* (2006.01)

(58) Field of Classification Search
USPC .................................................. 204/298.26
See application file for complete search history.

(56) References Cited

U.S. PATENT DOCUMENTS

| | | | | |
|---|---|---|---|---|
| 2006/0159844 | A1* | 7/2006 | Moriwaki | C23C 14/562 427/127 |
| 2011/0180388 | A1* | 7/2011 | Morikawa | C23C 14/022 204/192.3 |
| 2013/0081942 | A1* | 4/2013 | Hinata | C23C 14/3464 204/298.03 |
| 2013/0292244 | A1* | 11/2013 | Ockenfuss | H01J 37/34 204/192.22 |

FOREIGN PATENT DOCUMENTS

| | | |
|---|---|---|
| JP | 2005-301208 A | 10/2005 |
| JP | 2010-106344 A | 5/2010 |
| JP | 2011-104781 A | 6/2011 |
| JP | 2012-031494 A | 2/2012 |
| JP | 2012-251193 A | 12/2012 |
| TW | 201240811 A | 10/2012 |
| WO | PCT/JP2011/063467 * | 4/2012 |
| WO | 2012/060338 A1 | 5/2012 |

OTHER PUBLICATIONS

Chinese Office Action of related Chinese patent application No. 201280077793.6 dated Jun. 12, 2016.
Daisuke Noguchi et al., "Photoinduced Hydrophilicity and Structural Evaluation of SiOx: OH/TiO2 Multilayer Films", Japanese Journal of Applied Physics, vol. 45, No. 3A, pp. 1775-1782, 2006.
Daisuke Noguchi et al., "Photo-Induced Hydrophilicity of SiOx: OH/TiO2 Multilayer Films", Japanese Journal of the Ceramic Society of Japan, vol. 113, No. 9, pp. 630-633, 2005.
International Search Report of PCT/JP2012/082774 dated Jan. 29, 2013.

* cited by examiner

FILM FORMATION METHOD AND FILM FORMATION APPARATUS

CROSS-REFERENCE TO RELATED APPLICATION

This application is a National Stage entry of International Application No. PCT/JP2012/082774, filed Dec. 18, 2012. The disclosure of the priority application is incorporated in its entirety herein by reference.

TECHNICAL FIELD

The present invention relates to a film formation method and a film formation apparatus.

BACKGROUND ART

At the present time, there has widely been used a touch panel for a variety of terminals such as portable terminals, which is manipulated through the direct contact of the surface of the panel with the human body. The surface of this touch panel is provided with a stain-proofing layer (an organic layer) since the human body directly comes in touch with the same and it is accordingly liable to be damaged and/or impaired and to become dirty.

In many cases, a fluorine-containing resin has been used as such a stain-proofing layer. As a method for forming a film consisting of such a fluorine-containing resin, there has been known the vacuum deposition technique (see, for instance, Patent Document 1 given below).

PRIOR ART LITERATURE

Patent Document

[Patent Document 1] Japanese Patent Laid-Open No. 2010-106344

DISCLOSURE OF THE INVENTION

Problems that the Invention is to Solve

According to Patent Document 1, a film excellent in film quality can efficiently be formed by the vapor deposition technique. However, in some cases, the adhesion between a stain-proofing layer and its underlying layer is gradually reduced as the number of uses of the film increases or the number of contact times thereof increases.

Accordingly, it is an object of the present invention to solve the foregoing problems associated with the conventional techniques and to provide a film formation method as well as a film formation apparatus, which permit the formation of a film having high adhesion to an organic layer formed thereon and consisting of a fluorine-containing resin even if the number of uses of the same increases.

Means for the Solution of the Problems

The film formation method according to the present invention is a method which comprises the step of forming an organic layer consisting of a fluorine-containing resin on an inorganic layer formed on a substrate to be processed and consisting of an inorganic material, wherein when forming the inorganic layer, an inorganic layer is formed on the substrate to be processed according to the reactive sputtering technique, while using water vapor as a reactive gas and thereafter the foregoing organic layer is formed on the inorganic layer thus produced.

According to the present invention, an inorganic layer is formed, on a substrate to be processed, by the reactive sputtering technique while using water vapor as a reactive gas and as a result, the method of the present invention makes it possible to form an inorganic layer excellent in the adhesion thereof to the organic layer subsequently applied onto the same.

The foregoing inorganic layer is preferably a layer comprising at least one member selected from the group consisting of Si, Al, Ta, Nb, Ti, Zr, Sn, Zn, Mg and In. The incorporation of at least one of these elements into the inorganic layer would permit the improvement of the adhesion of the layer to an organic layer subsequently applied thereto.

In addition, the aforementioned inorganic layer is preferably formed by depositing at least two inorganic films in layers in which at least the upper most film among them is formed by the reactive sputtering technique, while using water vapor as a reactive gas. If the upper most layer is formed according to the reactive sputtering technique, while using water vapor as a reactive gas, in this way, an inorganic layer, which is excellent in the adhesion thereof to the organic layer subsequently applied onto the same, can be formed even if the inorganic layer comprises a plurality of films.

In the present invention, it is preferred to form the foregoing inorganic layer by carrying out the reactive sputtering method, while using water vapor as a reactive gas, and then subjecting the resulting inorganic layer to a plasma treatment using water vapor. If the method of the present invention is designed in this way, it may likewise permit the formation of an inorganic layer excellent in the adhesion to the organic layer subsequently formed thereon.

The film formation apparatus according to the present invention is an apparatus comprising an inorganic layer-forming chamber provided with an inorganic layer-forming means in which an inorganic layer is formed on a substrate to be processed; an organic layer-forming chamber equipped with an organic layer-forming means in which an organic layer consisting of a fluorine-containing resin is formed, wherein the inorganic layer-forming means comprises a water vapor-introducing means for the introduction of water vapor into the inorganic layer-forming chamber, a sputtering target and an electric voltage-application means for applying an electric voltage to the sputtering target; and wherein, in the inorganic layer-forming chamber, water vapor is introduced into the inorganic layer-forming chamber through the water vapor-introducing means and an electric voltage is applied, through the electric voltage-application means, to thus form a plasma and to thereby form an inorganic layer on the foregoing substrate to be processed, and thereafter the foregoing organic layer is formed on the substrate to be processed, on which the inorganic layer has been formed, by operating the organic layer-forming means. According to the film formation apparatus of the present invention, water vapor as a reactive gas for the reactive sputtering operation is introduced into the film formation apparatus through the water vapor-introduction means to thus form an inorganic layer and the resulting inorganic layer is excellent in the adhesion thereof to an organic layer subsequently applied thereto.

According to a preferred embodiment of the present invention, in the foregoing film formation apparatus, each of the foregoing inorganic film-forming chamber and the foregoing organic layer-forming chamber is equipped with a vacuum exhaust means, respectively and these chambers are arranged in series in this order.

Moreover, as a preferred embodiment to be used when forming an inorganic layer consisting of a plurality of layers put on top of each other, there may be mentioned a film formation apparatus which is provided, at the center thereof, with a rotating drum serving as a transporting means wherein the substrate to be processed is placed on the surface thereof and wherein the space surrounding the rotating drum is partitioned into the foregoing inorganic layer-forming chamber and the foregoing organic layer-forming chamber, the chambers being accordingly arranged around the rotating drum.

Effects of the Invention

The film formation method and the film formation apparatus according to the present invention permit the achievement of such an excellent effect that the adhesion between an inorganic layer and an organic layer subsequently deposited on the same and consisting of a fluorine-containing resin is high irrespective of the number of uses thereof.

MODE FOR CARRYING OUT THE INVENTION (Embodiment 1)

Figure 1:
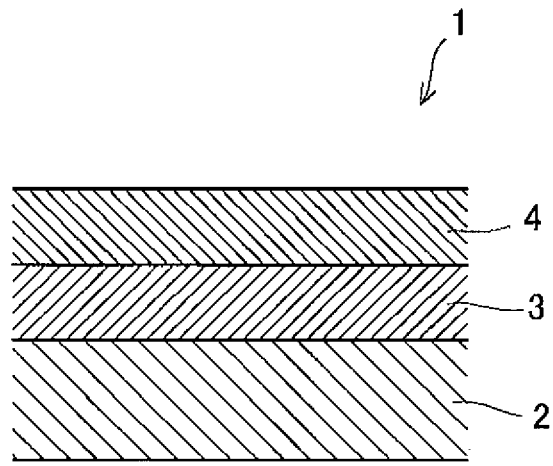
FIG. 1 is a schematic cross sectional view illustrating the laminated structure produced by the film formation method according to Embodiment 1 as will be discussed below.

The present invention will hereunder be described in detail with reference to FIG. 1. FIG. 1 is a schematic cross sectional view showing a laminated structure 1. Laminated structure 1 consists essentially of a transparent substrate 2 an inorganic layer 3 formed on transparent substrate 2 and a stain-proofing layer 4 deposited on inorganic layer 3.

Transparent substrate 2 serves to protect an element accommodated on one side of the substrate (the side of the substrate opposite to inorganic layer 3) and constitutes a touch panel. As materials used for forming such a transparent substrate 2, there may be listed, for instance, a transparent resin film and a glass plate. In the present embodiment, the transparent substrate is made of glass. In this respect, transparent substrate 2 used in the present embodiment is not restricted to those each having a transmittance of 100% and may accordingly be so-called translucent ones.

Inorganic layer 3 is used for the improvement of the adhesion between stain-proofing layer 4 and transparent substrate 2. As will be described more in detail below, this inorganic layer 3 is improved in the adhesion to stain-proofing layer 4 by the use of the reactive sputtering technique while using water vapor as a reactive gas, in the preparation of the inorganic layer.

Inorganic layer 3 is formed from an inorganic material. In the present embodiment, there may be listed, as examples of such inorganic materials, at least one oxides, oxynitrides and nitrides of metals selected from the group consisting of Si, Al, Ta, Nb, Ti, Zr, Sn, Zn, Mg and In. Among these inorganic materials, preferably used herein include, for instance, silicon oxide, silicon nitride, silicon nitrided oxide, aluminum oxide, aluminum nitride, aluminum nitrided oxide, titanium oxide, magnesium oxide, indium oxide, tin oxide, zinc oxide, tantalum oxide, niobium oxide, and zirconium oxide and these materials may be used, in the present embodiment, alone or in any mixture thereof. In the present embodiment, the inorganic layer contains Si as such an inorganic material.

The thickness of inorganic layer 3 may appropriately be set at a level ranging from 1 to 1,000 nm and preferably 5 to 150 nm. This is because if the thickness of inorganic layer 3 is less than the foregoing lower limit, the resulting layer does not ensure the achievement of any desired adhesion thereof to the stain-proofing layer. On the other hand, if the thickness of inorganic layer 3 exceeds the foregoing upper limit, the resulting film is liable to be easily cracked due to the stress induced between them and a longer film-forming time would be required correspondingly.

Stain-proofing layer 4 is a fluorine atom-containing organic layer. The use of this stain-proofing layer 4 permits the protection of the touch panel surface from the formation of any cracks or scratch marks and from the contamination with fingerprints, for instance, encountered when the human body comes in contact with the touch panel. The fluorine-containing resins used herein for the construction of stain-proofing layer 4 may be, for instance, those in which the backbone thereof comprises repeating units such as $CF_2=$, $—CF_2—$ and $—CFH—$, and used in the present embodiment is one comprising a perfluoropolyether group having a linear chain structure. In addition, the fluorine-containing resins used in the present embodiment for the construction of stain-proofing layer 4 is one in which the foregoing polymer backbone has a silicon atom at the terminal thereof, and an alkoxy group is added to the silicon atom situating at the end of the polymer backbone through an oxygen-silicon linkage.

The thickness of stain-proofing layer 4 is not particularly limited to any specific range, but it can appropriately be set at a level ranging from 0.0005 to 5 μm. This is because if the thickness of the stain-proofing layer is less than 0.0005 μm, the stain-proofing layer cannot exert a sufficient stain-proofing effect, while if it exceeds 5 μm, the resulting stain-proofing layer may suffer from various inconveniences, for instance, the transmittance of the resulting layer being reduced.

Such a laminated structure 1 is formed according to the following procedures:

First of all, an inorganic layer 3 is formed on the surface of a transparent substrate 2 consisting of a glass substrate. As film formation methods usable herein for forming such an inorganic layer 3, there can be listed, for instance, the CVD, plasma CVD, sputtering and ion plating techniques. In this connection, as the sputtering technique, there may further be listed, for instance, the ECR sputtering, reactive sputtering, bias sputtering and crossed field acceleration type sputtering techniques. In the present embodiment, the laminated structure or the inorganic layer is formed according to the reactive sputtering technique. In this respect, the conditions for forming a film according to the reactive sputtering technique are as follows: sputtering target: Si target; inert gas: Ar gas; reactive gas: water vapor ($H_2O$); flow rate of Ar gas: 10 to 200 sccm; flow rate of water vapor: 100 to 400 sccm; and input power: 1 to 12 kW. The conditions for forming a film used in the present embodiment are as follows: sputtering target: Si target; inert gas: Ar gas;

reactive gas: water vapor (H$_2$O); flow rate of Ar gas: 30 sccm; flow rate of water vapor: 300 sccm; and input power: 8 kW. In this connection, used herein as such an inert gas may likewise be an inert gas, which can generally be used in the sputtering technique, such as He or Ne.

In this way, inorganic layer 3 is formed, in the present embodiment, according to the reactive sputtering technique while using water vapor as a reactive gas and as a result, OH groups included in water vapor are linked with the surface of inorganic layer 3. The adhesion of inorganic layer 3 to a stain-proofing layer 4 is improved due to the formation of linkages between the OH groups and the surface of the inorganic layer. In other words, an alkoxy group is added to the silicon atom situated at the terminal of a polymer backbone constituting the fluorine-containing resin of stain-proofing layer 4 through an oxygen-silicon linkage and therefore, when forming stain-proofing layer 4 on the surface of inorganic layer 3, the alkoxy group is converted into a hydroxyl group through the hydrolysis thereof. As a result, this hydroxyl group and the OH groups present on the surface of inorganic layer 3 form siloxane bonds through the dehydration condensation reaction between them. The siloxane bonds thus formed would be able to highly strengthen the linkage of inorganic layer 3 with strain-proofing layer 4 to thereby improve the adhesion between these layers.

In this case, it is preferred that water vapor is used as a reactive gas when forming inorganic layer 3 according to the reactive sputtering technique, to thus form a linkage between the surface of inorganic layer 3 and OH groups and accordingly, the OH group-linking treatment can easily and less expensively be carried out.

It is also possible to form linkages between OH groups and the surface of inorganic layer 3, even when, for example, a silicon oxide layer is first formed according to the reactive sputtering technique using oxygen gas as a reactive gas and the resulting silicon oxide layer is then subjected to a plasma treatment in an atmosphere of water vapor to thus form linkages between OH groups and the surface of the silicon oxide layer. However, inorganic layer 3 can be formed by carrying out the reactive sputtering procedures while using water vapor as a reactive gas as in the present embodiment and this accordingly permits the reduction (by one step) of the number of steps required for forming a desired inorganic layer and this would accordingly permit the reduction of the required cycle time (takt time).

In the present embodiment, only water vapor is used as the reactive gas for the reactive sputtering operation, but other reactive gases can likewise be introduced into the reactive sputtering step. Examples of such other gases include oxygen atom-containing gases such as oxygen gas and hydrogen atom-containing gases such as hydrogen gas.

Thereafter, a stain-proofing layer 4 is formed on the surface of this inorganic layer 3. As methods for forming such a stain-proofing layer 4, usable herein are, for instance, the coating technique and the evaporation or vapor deposition technique. In the present embodiment, the evaporation technique is employed.

Vacuum deposition techniques usable herein include, for instance, the vacuum deposition technique, the ion beam evaporation technique, the resistance heating type vapor deposition technique, but used in the present embodiment is the resistance heating type vapor deposition technique in which the vapor deposition process is carried out by heating an evaporation source under a predetermined pressure condition. The expression "predetermined pressure condition" herein used means a pressure set at a level ranging from $1 \times 10^{-4}$ to $1 \times 10^{-2}$ Pa. In the present embodiment, an evaporation source sold by DAIKIN INDUSTRIES, Ltd. under the trade name of Optool DSX is heated up to a temperature of 220° C. using a heating means, while controlling the pressure used for carrying out the vapor deposition process, in such a manner that it is maintained at a level ranging from $2 \times 10^{-3}$ to $4 \times 10^{-4}$ Pa to thus form a vapor deposited film having a thickness of 2 nm.

Figure 2:
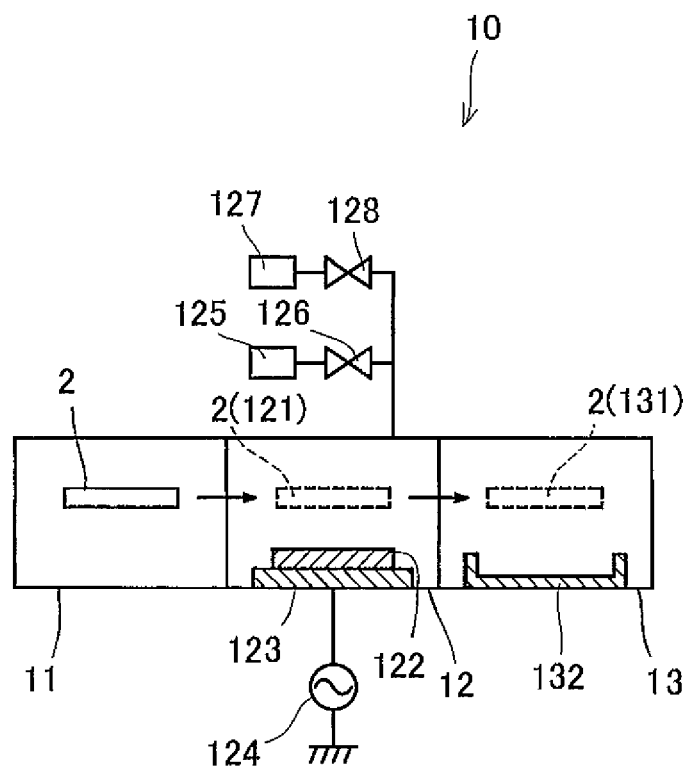
FIG. 2 is a block schematic diagram showing an outlined construction of the film formation apparatus according to Embodiment 1.

The film formation apparatus according to the present embodiment will now be described in detail below with reference to the attached FIG. 2. A film formation apparatus 10 is a so-called in-line type film formation apparatus and a processing chamber, in which a substrate is subjected to desired treatments, is connected to the film formation apparatus in series. Film formation apparatus 10 is provided with a load-lock chamber 11, an inorganic layer-forming chamber 12 and a stain-proofing layer-forming chamber 13 arranged in this order. In this respect, a transparent substrate 2 is supported on and conveyed by a transportation tray, which serves as a transporting means, within film formation apparatus 10. Further, the transporting means used in the present embodiment is one consisting of a transportation tray, on which transparent substrate 2 is placed and mounted, and a transfer means for moving or conveying the transportation tray.

Transparent substrate 2 stored in the atmosphere is brought into load-lock chamber 11. Load-lock chamber 11 is so designed that a vacuum pump (not shown) is arranged within the same so as to be able to evacuate load-lock chamber 11 to a predetermined degree of vacuum and to maintain the degree of vacuum in the chamber at that level. Furthermore, each processing chamber is provided with a vacuum pump so that each processing chamber can independently be evacuated to a desired degree of vacuum, although this is not shown in this figure.

Inorganic layer-forming chamber 12 is one for forming an inorganic layer 3 (see FIG. 1) on the surface of transparent substrate 2 according to the sputtering technique. Transparent substrate 2 which is transported to inorganic layer-forming chamber 12, is placed at a substrate-setting up position 121 by a transporting means (not shown). Within inorganic layer-forming chamber 12, a sputtering target 122 is placed on and supported by a target-supporting member 123 in such a manner that target 122 is opposed to transparent substrate 2 placed at substrate-setting up position 121. Target-supporting member 123 is so designed that a high frequency power source 124 is connected to target-supporting member 123 so that an electric voltage can be applied to sputtering target 122.

Sputtering target 122 is made of a material appropriately selected while taking into consideration the material for the inorganic layer. In the present embodiment, a target of metal silicon is set up, as sputtering target 122, to thus form an SiO$_2$ film as the intended inorganic layer.

In addition, inorganic layer-forming chamber 12 is provided with or connected, through a first valve 126, to a first gas-enclosing member 125 containing an enclosed inert gas. The control of the aperture of first valve 126 enables the introduction of a desired amount of the inert gas from first gas-enclosing member 125 into inorganic layer-forming chamber 12. In the present embodiment, Ar gas as an inert gas is enclosed in first gas-enclosing member 125. Moreover, inorganic layer-forming chamber 12 is also provided with or connected, through a second valve 128, to a second gas-enclosing member 127 containing an enclosed reactive gas. The control of the aperture of second valve 128 enables the introduction of a desired amount of the reactive gas from second gas-enclosing member 127 into inorganic layer-forming chamber 12. Gaseous H$_2$O as the reactive gas is enclosed in second gas-enclosing member 127.

Stain-proofing layer-forming chamber 13 is one for forming a stain-proofing layer 4 (see FIG. 1) on the surface of transparent substrate 2 according to the vapor deposition technique. Transparent substrate 2 which is transported to stain-proofing layer-forming chamber 13, is placed at a substrate-setting up position 131 by the action of a transporting means (not shown). A vapor deposition means 132 is arranged within stain-proofing layer-forming chamber 13 such that vapor deposition means 132 is opposed to transparent substrate 2 likewise arranged in the stain-proofing layer-forming chamber. In the present embodiment, vapor deposition means 132 comprises an evaporation source (not shown) placed or contained in a crucible provided with a heating means, although the vapor deposition means to be used may vary depending on the vapor deposition method selected.

The film-forming operations which make use of such a film formation apparatus 10 will now be described below in detail. When transparent substrate 2 is transported into load-lock chamber 11, the latter chamber is evacuated for establishing a desired vacuum in the load-lock chamber. After the establishment of a desired vacuum in the load-lock chamber, transparent substrate 2 is transported to inorganic layer-forming chamber 12. Thus an inorganic layer is deposited on the surface of transparent substrate 2 within inorganic layer-forming chamber 12. More specifically, an inert gas and a reactive gas are introduced into inorganic layer-forming chamber 12 through first gas-enclosing member 125 and second gas-enclosing member 127, respectively by independently controlling the apertures of first valve 126 and second valve 128, while simultaneously applying an electric voltage to sputtering target 122 through high frequency power source 124 to thus initiate the reactive sputtering operations and to thereby form an inorganic layer 3.

Then transparent substrate 2 is transported from inorganic layer-forming chamber 12 to stain-proofing layer-forming chamber 13. In stain-proofing layer-forming chamber 13, a stain-proofing layer 4 is thus formed on the surface of inorganic layer 3 previously deposited. More specifically, the crucible is heated by the heating means and the evaporation source thus heated and evaporated is deposited on the surface of inorganic layer 3 formed on transparent substrate 2 which is transported to the stain-proofing layer-forming chamber to thus form a stain-proofing layer 4.

After the formation of stain-proofing layer 4, transparent substrate 2 is transferred to load-lock chamber 11, the load-lock chamber maintained at a vacuum is released to the atmospheric pressure and then transparent substrate 2 is carried out of film formation apparatus 10.

In this way, according to film formation apparatus 10 of the present embodiment, OH groups present in water vapor can easily be combined or linked with the surface of inorganic layer 3 if the reactive sputtering operation is carried out in inorganic layer-forming chamber 12, while using water vapor as the reactive gas. As a result, this permits the improvement of the adhesion between inorganic layer 3 and stain-proofing layer 4.

(Embodiment 2)

Figure 3:
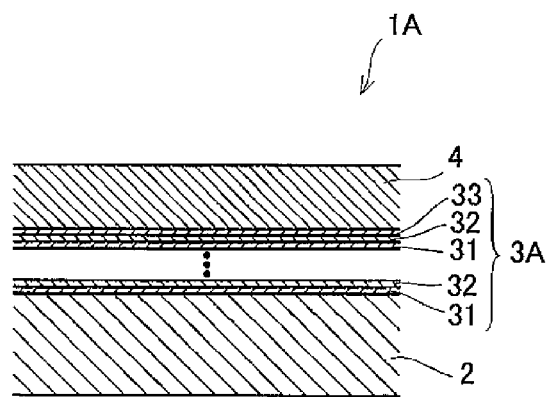
FIG. 3 is a schematic cross sectional view illustrating the laminated structure produced by the film formation method according to Embodiment 2 as will be discussed below.

The laminated structure according to the present embodiment will be described in detail below with reference to the accompanying FIG. 3. As shown in FIG. 3, a laminated structure 1A according to the present embodiment differs from inorganic layer 3 (see FIG. 1) according to the foregoing embodiment 1 in that an inorganic layer 3A is composed of a plurality of layers.

Inorganic layer 3A according to the present embodiment comprises plural pairs each consisting of a first inorganic layer 31 and a second inorganic layer 32 in this order and an upper most layer (i.e., the layer to be intimately contact with a stain-proofing layer 4) or a third inorganic layer 33 which is formed according to the aforementioned method or according to the reactive sputtering technique using water vapor as the reactive gas. Inorganic layer 3A according to the present embodiment functions as the aforementioned inorganic layer 3 (see FIG. 1) and simultaneously serves as an anti-reflection layer. Deposited third inorganic layer 33 constituting the surface of inorganic layer 3A is also formed according to the reactive sputtering technique using water vapor as a reactive gas and therefore, it is excellent in the adhesion to stain-proofing layer 4.

Usable herein as materials for forming inorganic layer 3A are identical to those discussed above in connection with the foregoing inorganic layer 3, there may accordingly be listed, for instance, Si, Al, Ta, Nb, Ti, Zr, Sn, Zn, Mg and In, which may likewise be used alone or in any combination in the present embodiment, provided that the materials for forming first inorganic layer 31 and second inorganic layer 32 are different from one another. In this respect, the material used for forming third inorganic layer 33 maybe identical to that used for forming first inorganic layer 31 or second inorganic layer 32. Furthermore examples of materials used for forming first inorganic layer 31 include silicon oxide, silicon nitride, silicon nitrided oxide, aluminum oxide, aluminum nitride, aluminum nitrided oxide, titanium oxide, magnesium oxide, indium oxide, tin oxide, zinc oxide, tantalum oxide, niobium oxide, and zirconium oxide and these materials may be used alone or in any mixture thereof in the present embodiment. In particular, the materials used for forming first inorganic layer 31 are preferably tantalum oxide (Ta$_2$O$_5$), niobium oxide (Nb$_2$O$_5$), titanium oxide (TiO$_2$) and in particular, first inorganic layer 31 preferably consists of a Ta$_2$O$_5$ film. In respect of the third inorganic layer 33, this layer is formed under the same conditions used for forming the inorganic layer 3 described above in connection with Embodiment 1 and it consists of silicon oxide in the present embodiment.

Further in the present embodiment, inorganic layer 3A comprises two kinds of films put in layers successively except for third inorganic layer 33, but inorganic layer 3A is not limited to one having such a construction and it may comprise three or more kinds of films put in layers successively.

When forming inorganic layer 3A according to the present embodiment, examples of the film formation method for producing each layer constituting the same include the CVD, plasma CVD, sputtering and ion plating techniques. In this connection, as the sputtering technique, there may further be listed, for instance, the ECR sputtering, reactive sputtering, bias sputtering and crossed field acceleration type sputtering techniques. In the present embodiment, each layer is formed according to the reactive sputtering technique.

For instance, when forming such an adhesion layer 3A, the conditions for forming first inorganic layer 31 usable herein are as follows: sputtering target: Ta target; sputtering gas: Ar+O$_2$; flow rate of Ar gas: 50 to 500 sccm; flow rate of O$_2$ gas: 50 to 500 sccm; and input power: 1 to 10 kW. In addition, the conditions for forming the second inorganic layer 32 are as follows: sputtering target: Si target; sputtering gas: Ar+O$_2$; flow rate of Ar gas: 50 to 500 sccm; flow rate of O$_2$ gas: 50 to 500 sccm; and input power: 1 to 10 kW. Further the conditions for forming third inorganic layer 33, which is formed using water vapor as a reactive gas, are as follows: sputtering target: Si target; inert gas: Ar gas; reactive gas: $H_2O$ gas; flow rate of Ar gas: 10 to 200 sccm; flow rate of $H_2O$ gas: 100 to 400 sccm; and input power: 1 to 12 kW.

In the present embodiment, the conditions for forming first inorganic layer 31 are as follows: sputtering target: Ta target; sputtering gas: $Ar+O_2$; flow rate of Ar gas: 100 sccm; flow rate of $O_2$ gas: 300 sccm; and input power: 8 kW. In addition, the conditions for forming second inorganic layer 32 are as follows: sputtering target: Si target; sputtering gas: $Ar+O_2$; flow rate of Ar gas: 50 sccm; flow rate of $O_2$ gas: 200 sccm; and input power: 8 kW. Further the conditions for forming the third inorganic layer 33, which is formed using water vapor as a reactive gas, are as follows: sputtering target: Si target; inert gas: Ar gas; reactive gas: $H_2O$ gas; flow rate of Ar gas: 30 sccm; flow rate of $H_2O$ gas: 300 sccm; and input power: 8 kW.

Figure 4:
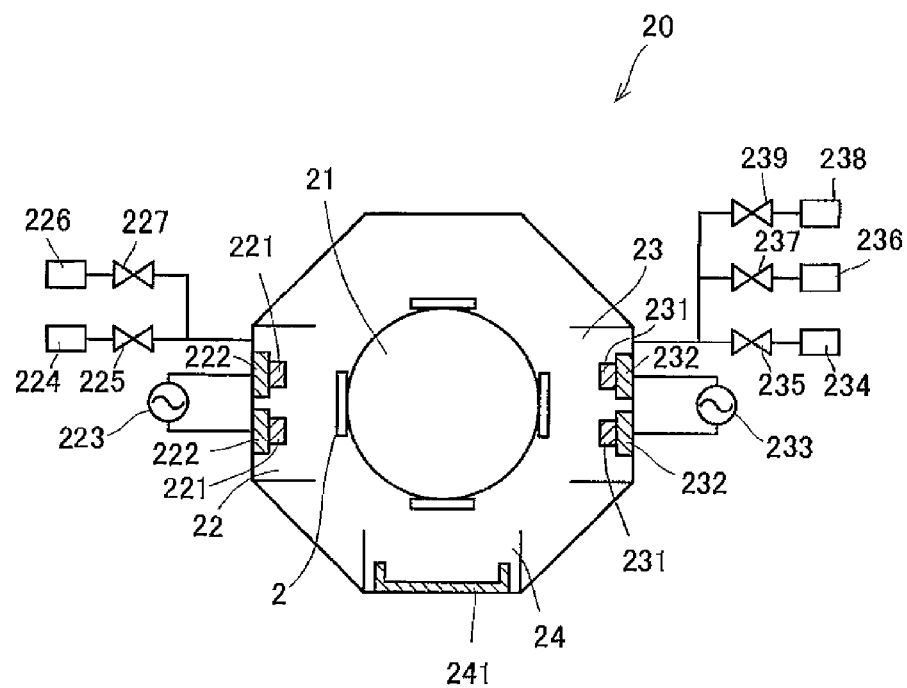
FIG. 4 is a block schematic diagram showing an outlined construction of the film formation apparatus according to Embodiment 2.

The film formation apparatus used for the formation of such a laminated structure 1A will now be described in detail below with reference to the attached FIG. 4.

A film formation apparatus 20 according to the present embodiment is provided with a rotating drum 21 positioned at the center of the film formation apparatus. A plurality of transparent substrates 2 are placed and arranged on this rotating drum 21. In other words, the film formation apparatus 20 according to the present embodiment is so designed that rotating drum 21 functions as a substrate-setting up member. Rotating drum 21 is rotatable and accordingly, each of the plural number of transparent substrates 2, which are mounted on the surface of rotating drum 21, can be subjected to each required treatment. Film formation apparatus 20 is equipped with a vacuum pump (not shown) and therefore, film formation apparatus 20 can be evacuated to thus establish a desired degree of vacuum within the same.

Further the internal space of the film formation apparatus 20 is divided into a plurality of processing chambers. In the present embodiment, film formation apparatus 20 is divided into a first layer-forming chamber 22, a second layer-forming chamber 23 and a stain-proofing layer-forming chamber 24, which are arranged along the circumference thereof. First layer-forming chamber 22 and second layer-forming chamber 23 are arranged within the apparatus in such a manner that they are opposed to one another, while stain-proofing layer-forming chamber 24 is arranged or positioned at a region situating between first layer-forming chamber 22 and second layer-forming chamber 23.

First layer-forming chamber 22 and second layer-forming chamber 23 each are so designed that a first inorganic layer 31 or a second inorganic layer 32 (see FIG. 3) can be formed according to the sputtering technique. More specifically, first inorganic layer 31 is formed in first layer-forming chamber 22 according to the sputtering technique, while second inorganic layer 32 is formed in second layer-forming chamber 23 likewise according to the sputtering technique. In this connection, although the details will be described later, second layer-forming chamber 23 is so designed that a third inorganic layer 33 can also be formed therein.

First layer-forming chamber 22 is provided with a pair of sputtering targets 221 for forming the first layer, which are mounted on and supported by target-supporting members 222, respectively. Each target-supporting member 222 is connected to a high frequency power source 223. Thus, positive and negative voltages, which are opposite to one another, can be applied to the paired sputtering targets 221 for forming the first layer, respectively. In addition, first layer-forming chamber 22 is connected, through a third valve 225, to a third gas-enclosing member 224 in which an inert gas is enclosed and it is simultaneously connected, through a fourth valve 227, to a fourth gas-enclosing member 226 in which a reactive gas is enclosed. In the present embodiment, Ar gas as an inert gas is enclosed in third gas-enclosing member 224, while $O_2$ gas as a reactive gas is enclosed in fourth gas-enclosing member 226.

Second layer-forming chamber 23 is provided with a pair of sputtering targets 231 for forming the second layer, which are mounted on and supported by target-supporting members 232, respectively. These target-supporting members 232 are connected to a high frequency power source 233. Moreover, second layer-forming chamber 23 is connected, through a fifth valve 235, to a fifth gas-enclosing member 234 in which an inert gas is enclosed and it is simultaneously connected, through a sixth valve 237, to a sixth gas-enclosing member 236 in which a reactive gas is enclosed. In the present embodiment, Ar gas as an inert gas is enclosed in fifth gas-enclosing member 234, while $O_2$ gas as a reactive gas is enclosed in the sixth gas-enclosing member.

Furthermore, second layer-forming chamber 23 is connected, through a seventh valve 239, to a seventh gas-enclosing member 238 in which water vapor serving as a reactive gas is enclosed. In other words, in the present embodiment, this second layer-forming chamber 23 is so designed that water vapor as the reactive gas can be introduced into second layer-forming chamber 23 when carrying out an intended reactive sputtering operation and that a third inorganic layer 33 can accordingly be formed.

A vapor deposition means 241 is installed within stain-proofing layer-forming chamber 24. In the present embodiment, vapor deposition means 241 is one comprising an evaporation source (not shown) arranged in a crucible provided with a heating means, although the construction thereof may vary depending on the vapor deposition techniques selected.

The film formation procedures according to such a film formation apparatus 20 will be described below in detail. A plurality of transparent substrates 2 are transported into film formation apparatus 20 and transparent substrates 2 thus transferred to the film formation apparatus are placed, respectively, on rotating drum 21 at predetermined spaces. Subsequently, film formation apparatus 20 is evacuated so as to establish a desired degree of vacuum within the apparatus. After the establishment of a desired vacuum condition, the rotation of rotating drum 21 is initiated. The rotating drum 21 is continuously rotated in one direction till all of the intended films are deposited on all of transparent substrates 2 placed on the drum.

First of all, the reactive sputtering operation is carried out, using oxygen gas, in first layer-forming chamber 22 to thus form a first inorganic layer 31 consisting of a $Ta_2O_5$ film on transparent substrate 2. Then rotating drum 21 is rotated to form a first inorganic layer 31 on another transparent substrate 2 likewise placed on the rotating drum and rotating drum 21 is again rotated after the formation of the first inorganic layers 31. After the film formation operations for all of transparent substrates 2 arranged on rotating drum 21 are thus completed, the formation of second inorganic layers 32 (see FIG. 3) is then initiated. In other words, the reactive sputtering operation is carried out in second layer-forming chamber 23, while using water vapor as a reactive gas to thus form second inorganic layers 32 on every corresponding transparent substrate 2.

In this way, second inorganic layer 32 is formed on first inorganic layers 31 on every transparent substrate 2 and then the sputtering operation is again initiated in first layer-forming chamber 22 to thus form a first inorganic layer 31 on each of second inorganic layers 32. Further first inorganic layer 31 and second inorganic layer 32 are successively deposited in layers in this order to thus give each corresponding laminated part of inorganic layer 3A (see FIG. 3).

Thereafter a third inorganic layer 33 is formed, in second layer-forming chamber 23, on the foregoing laminate part of inorganic layer 3A (see FIG. 3), which has been formed according to the reactive sputtering technique using water vapor as a reactive gas, to thus form intended inorganic layer 3A.

Finally, a stain-proofing layer 4 (see FIG. 3) is formed on inorganic layer 3A produced above. More specifically, a stain-proofing layer is formed by starting the heating of the evaporation source contained in vapor deposition means 241 positioned within stain-proofing layer-forming chamber 24, and depositing the heated evaporation source on inorganic layer 3A which has been applied onto the surface of transparent substrate 2.

Once stain-proofing layer 4 is formed, film formation apparatus 20 is released from vacuum to establish the atmospheric pressure therein and transparent substrates 2, each of which is thus provided with a stain-proofing layer 4, are carried out of film formation apparatus 20.

In this manner, according to film formation apparatus 20 of the present embodiment, OH groups present in water vapor can easily be combined or linked with the surface of inorganic layer 3A if the reactive sputtering operation is carried out in second layer-forming chamber 23, while using water vapor as a reactive gas to thus form third inorganic layer 33. As a result, this permits the improvement of the adhesion between inorganic layer 3A and stain-proofing layer 4.

Embodiments of the present invention will hereunder be described in more detail with reference to the following Examples.

EXAMPLE 1

A laminated structure 1 was produced using the film formation apparatus according to Embodiment 1 under the conditions specified in the following Table 1. In this respect, the conditions, which are not clearly specified, are the same as those discussed above in connection with Embodiment 1.

COMPARATIVE EXAMPLE 1

A laminated structure was produced under the same conditions as those used in Example 1, except that in the inorganic layer-forming step, oxygen gas was substituted for the water vapor used in Example 1 in the reactive sputtering operation.

COMPARATIVE EXAMPLE 2

A laminated structure was produced under the same conditions used in Example 1, except that, in the inorganic layer-forming step, oxygen as was substituted for the water vapor used in Example 1 in the reactive sputtering operation to form a silicon oxide film and that after the reactive sputtering operation, OH groups were added to the surface of the silicon oxide film according to a plasma treatment using water vapor. In this respect, the conditions for the plasma treatment are as follows: flow rate of water vapor: 150 sccm; and input power: 1,500 kW.

EXAMPLE 2

A laminated structure was produced under the same conditions used in Example 1, except that after the formation of the inorganic layer according to the reactive sputtering technique using water vapor, the inorganic layer was subjected to a plasma treatment using water vapor (the conditions for the treatment were the same as those used in Comparative Example 2), while the vacuum was maintained in the film-forming chamber and then a stain-proofing layer was formed.

EXAMPLE 3

A third inorganic layer 33 was produced using the film formation apparatus according to Embodiment 2 under the conditions specified in the following Table 1 to thus obtain a laminated structure 1A. In this respect, the conditions, which are not clearly specified in Table 1, are the same as those discussed above in connection with Embodiment 2.

COMPARATIVE EXAMPLE 3

A laminated structure was produced under the same conditions as those used in Example 3, except that in the inorganic layer-forming step, water vapor was not used in the reactive sputtering operation (in other words, any third inorganic layer was not formed).

Each of the laminated structures produced in Examples 1 to 3 and Comparative Example 1 to 3 was subjected to a durability test to thus confirm the adhesion between the inorganic layer and the stain-proofing layer. The durability test comprises sliding reciprocally steel wool on the surface of the stain-proofing layer of each laminated structure while a load (1,000 g/cm$^2$) is applied thereto, then letting a water drop fall on the surface of the stain-proofing layer after the abrasion and determining the number of sliding motions required till the contact angle of the water drop reached a level of not more than 105 degrees. In this regard, the more the number of sliding motions is high, the more the peeling off of the stain-proofing layer is difficult and the more the adhesion between the stain-proofing layer and the inorganic layer is high. The results thus obtained are also listed in the following Table 1.

TABLE 1

| Ex. No. | Material of Target 1st layer | Material of Target 2nd layer | Inert Gas | Reactive Gas | Flow Rate of Inert Gas (sccm) | Flow Rate of Reactive Gas (sccm) | Input Power (kW) |
|---|---|---|---|---|---|---|---|
| 1 | Si | | Ar | H$_2$O | 30 | 300 | 8 |
| 2 | Si | | Ar | H$_2$O | 30 | 300 | 8 |
| 1* | Si | | Ar | O$_2$ | 30 | 200 | 8 |
| 2* | Si | | Ar | O$_2$ | 30 | 200 | 8 |
| 3 | Ta | Si | Ar | H$_2$O | 100 | 300 | 8 |
| 3* | Ta | Si | Ar | O$_2$ | 100 | 300 | 8 |

| Ex. No. | Presence of Plasma Treatment using Water Vapor | Conditions for Stain-Proofing Layer-Forming Operation | Limiting No. of Sliding Motions |
|---|---|---|---|
| 1 | No | Same as those used in Embodiment 1 | 12000 times |
| 2 | Yes | Same as those used in Embodiment 1 | 12000 times |
| 1* | No | Same as those used in Embodiment 1 | 1000 times |
| 2* | Yes | Same as those used in Embodiment 1 | 10000 times |
| 3 | No | Same as those used in Embodiment 2 | 12000 times |
| 3* | No | Same as those used in Embodiment 2 | 1000 times |

*Comparative Example

As shown in Table 1, it was found, in all of the products prepared in Examples, that the numbers of sliding times observed are high as compared with those observed for the products prepared in Comparative Examples and that the inorganic layer prepared in each Example is improved in the adhesion thereof to the stain-proofing layer. In Example 2, the inorganic layer was first formed according to the reactive sputtering technique while using water vapor as a reactive gas and then the inorganic layer thus formed was subjected to a plasma treatment using water vapor, but the results observed for the resulting product are the same as those observed for the product obtained in Example 1. If taking this fact into consideration, it was found that if water vapor is used for forming an inorganic layer, irrespective of whether a plasma treatment is used or not, a film having a sufficiently high adhesion to a stain-proofing layer can surely be prepared in Examples. It was found, when comparing Example 1 with Comparative Example 2, that the film obtained in Example 1, which is free from any plasma treatment, shows higher adhesion to a stain-proofing layer as compared with the film subjected to a plasma treatment and that the reactive sputtering technique using water vapor as in Embodiment 1 is superior, with respect to the adhesion-improving effect, to the technique in which a plasma treatment using water vapor is carried out after the formation of a silicon oxide film. In this regard, Comparative Example 2 was found to be excellent in the adhesion-improving effect of the resulting inorganic layer as compared with the same layer prepared in Comparative Example 1 and therefore, it could be confirmed that the adhesion of the inorganic layer to the stain-proofing layer can be improved by the addition of OH groups onto the surface of the inorganic layer.

(Other Embodiments)

The present invention is not restricted to the embodiments discussed above. For instance, the film formation apparatus is not restricted to those described above in connection with Embodiments 1 and 2 and may be any apparatus which would permit the implementation of the film formation methods relating to such embodiments. As an example, the film formation apparatus may be so designed that a plasma-treating means arranged in the plasma-processing chamber according to each of the embodiments discussed above and a vapor deposition means are installed within one film formation apparatus and that substrates can be arranged or placed at a position opposite to these means.

In the embodiments discussed above, the reactive sputtering operation is carried out using an inert gas and a reactive gas, but the present invention is not restricted to such specific embodiments and the reactive sputtering operation may likewise be implemented by the introduction of only a reactive gas into the same.

Moreover, in film formation apparatus 20 according to Embodiment 2, first layer-forming chamber 22 and second layer-forming chamber 23 are arranged in such a manner that these chambers are opposed to one another, but the present invention is not restricted to such particular embodiments and it is also possible to place the former at a position adjacent to the latter.

In addition, film formation apparatus 20 is so designed that third inorganic layer 33 can be formed in second layer-forming chamber 23, but the film formation apparatus is not limited to one having such a constitution and the apparatus may have a constitution which permits the formation of third inorganic layer 33 in first layer-forming chamber 22. More specifically, the apparatus is not limited to one having such a construction and it would be sufficient to design the apparatus in such a manner that water vapor can be introduced into the chamber for forming a layer which can be prepared by the use of the same inorganic material as that used for forming third inorganic layer 33. Moreover, it would of course be possible to install an independent third layer-forming chamber which permits the formation of a third inorganic layer 33.

Furthermore, in Embodiment 2, a high frequency electric voltage is established or applied between the two sputtering targets, but the present invention is not restricted to such a so-called dual type sputtering technique. For instance, a high frequency power source is connected to a single sputtering target such that a high frequency voltage can be established or applied between the sputtering target and a grounded or earthed substrate.

Although a film also serving as an antireflection layer is listed above as an example of inorganic layer 3A in the foregoing embodiment 2, inorganic layer 3A is never restricted to such a film and it may be a film with other optical functions.

Although third inorganic layer 33 is formed on second inorganic layer 32 in the foregoing embodiment 2, the present invention is not limited to such an embodiment and it is possible to successively deposit a plurality of first inorganic layers 31 and second inorganic layers 32 on a substrate in this order, then forming a first inorganic layer 31 thereon and thereafter forming a third inorganic layer 33 on the latter.

In each of the aforementioned embodiments, a stain-proofing layer is formed as an organic layer, but the function of the organic layer is not restricted to the stain-proofing one.

DESCRIPTION OF SYMBOLS 1, 1A: Laminated Structure; 2: Transparent Substrate; 3, 3A: Inorganic Layer; 4: Stain-Proofing Layer; 10: Film Formation apparatus; 11: Load-Lock Chamber; 12: Inorganic Layer-Forming Chamber; 13: Stain-Proofing Layer-Forming Chamber; 20: Film Formation apparatus; 21: Rotating Drum; 22: First Layer-Forming Chamber; 23: Second Layer-Forming Chamber; 24: Stain-Proofing Layer-Forming Chamber; 31: First Inorganic Layer; 32: Second Inorganic Layer; 33: Third Inorganic Layer.

What is claimed is:

1. A film formation method which comprises the step of forming an organic layer consisting of a fluorine-containing resin on an inorganic layer formed on a substrate to be processed and consisting of an inorganic material, wherein prior to forming the organic layer, the inorganic layer is formed on the substrate to be processed using the reactive sputtering technique using water vapor as a reactive gas and using Ar gas as an inert gas, wherein the flow rate of the Ar gas is 10 to 200 sccm and the flow rate of the water vapor is 100 to 400 sccm,
    wherein the reactive sputtering technique comprises linking hydroxyl groups provided by the water vapor with a surface of the inorganic layer.

2. The film formation method as set forth in claim 1, wherein the inorganic layer is a layer comprising at least one member selected from the group consisting of Si, Al, Ta, Nb, Ti, Zr, Sn, Zn, Mg and In.

3. The film formation method as set forth in claim 1, wherein the inorganic layer is produced by forming at least two inorganic films in layers and wherein at least the upper most film among the inorganic films is formed according to the reactive sputtering technique while using water vapor as a reactive gas.

4. The film formation method as set forth in claim 1, wherein the inorganic layer is formed by carrying out the reactive sputtering technique while using water vapor as a reactive gas and then carrying out a plasma treatment using water vapor.

5. The film formation method as set forth in claim 2, wherein the inorganic layer is produced by forming at least two inorganic films in layers and wherein at least the upper most film among the inorganic films is formed according to the reactive sputtering technique while using water vapor as a reactive gas.

6. The film formation method as set forth in claim 2, wherein the inorganic layer is formed by carrying out the reactive sputtering technique while using water vapor as a reactive gas and then carrying out a plasma treatment using water vapor.

7. The film formation method as set forth in claim 3, wherein the inorganic layer is formed by carrying out the reactive sputtering technique while using water vapor as a reactive gas and then carrying out a plasma treatment using water vapor.

8. The method of claim 1, wherein the flow rate of the Ar gas/the flow rate of the water vapor (Ar/$H_2O$) is less than or equal to 33%.

9. The method of claim 1, wherein forming the organic layer comprises formation of siloxane bonds between the fluorine-containing resin and the hydroxyl groups.

\* \* \* \* \*